United States Patent
Tianyi

(10) Patent No.: US 12,035,541 B2
(45) Date of Patent: Jul. 9, 2024

(54) SELECTOR DEVICE AND SEMICONDUCTOR STORAGE DEVICE

(71) Applicant: Kioxia Corporation, Tokyo (JP)

(72) Inventor: Gu Tianyi, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 387 days.

(21) Appl. No.: 17/462,600

(22) Filed: Aug. 31, 2021

(65) Prior Publication Data
US 2022/0302213 A1 Sep. 22, 2022

(30) Foreign Application Priority Data
Mar. 18, 2021 (JP) ................. 2021-044885

(51) Int. Cl.
| | | |
|---|---|---|
| *H10B 63/00* | (2023.01) | |
| *H10B 61/00* | (2023.01) | |
| *H10N 70/00* | (2023.01) | |
| *H10N 70/20* | (2023.01) | |

(52) U.S. Cl.
CPC ............. *H10B 63/24* (2023.02); *H10B 61/10* (2023.02); *H10N 70/231* (2023.02); *H10N 70/8828* (2023.02)

(58) Field of Classification Search
CPC ...... H10B 63/24; H10B 61/10; H10N 70/231; H10N 70/8828; H10N 70/826; H10N 70/8825; H10N 70/20; H10N 70/24; H10N 70/881; H10N 70/883; H10N 70/8845
See application file for complete search history.

(56) References Cited

U.S. PATENT DOCUMENTS

| | | | |
|---|---|---|---|
| 9,312,479 B2 | 4/2016 | Kim | |
| 10,497,867 B1 * | 12/2019 | Trinh | ................... H10N 70/063 |
| 2009/0290412 A1 * | 11/2009 | Mouli | ................ G11C 13/0014 |
| | | | 438/129 |
| 2010/0096609 A1 * | 4/2010 | Kim | ................... H10N 70/8413 |
| | | | 257/E47.001 |
| 2013/0337628 A1 | 12/2013 | Sonehara | |
| 2016/0087200 A1 | 3/2016 | Redaelli et al. | |
| 2018/0211703 A1 * | 7/2018 | Choi | ..................... H10B 63/24 |
| 2019/0006420 A1 | 1/2019 | Wells et al. | |
| 2020/0035916 A1 | 1/2020 | Trinh | |
| 2020/0295083 A1 | 9/2020 | Cheng et al. | |

FOREIGN PATENT DOCUMENTS

| | | |
|---|---|---|
| TW | 202006924 A | 2/2020 |
| TW | 202036850 A | 10/2020 |

* cited by examiner

*Primary Examiner* — Jerome Leboeuf
*Assistant Examiner* — Margaret B Hayes
(74) *Attorney, Agent, or Firm* — Foley & Lardner LLP

(57) ABSTRACT

A selector device includes: a first electrode; a second electrode; a selector layer that is disposed between the first electrode and the second electrode; and a stacked film that is disposed in at least one of a portion between the first electrode and the selector layer and a portion between the second electrode and the selector layer, and includes a first layer including at least one first element selected from the group consisting of carbon and metal and not including nitrogen and a second layer including nitride of the first element. The first layer is in contact with the selector layer.

17 Claims, 4 Drawing Sheets

SELECTOR DEVICE AND SEMICONDUCTOR STORAGE DEVICE

CROSS-REFERENCE TO RELATED APPLICATION

This application is based upon and claims the benefit of priority from Japanese Patent Application No. 2021-044885, filed Mar. 18, 2021, the entire contents of which are incorporated herein by reference.

FIELD

Embodiments described herein relate generally to a selector device and a semiconductor storage device.

BACKGROUND

For transitioning to ON and OFF states of a current to a variable resistance storage device such as a resistive random access memory (ReRAM), a phase change memory (PCM), and a magnetoresistive random access memory (MRAM), a selector device with a selector layer that changes a phase between the insulator and the conductor by the applied voltage is used. It is required to improve cycle characteristics of the selector layer in such a selector device.

DETAILED DESCRIPTION

Figure 1:
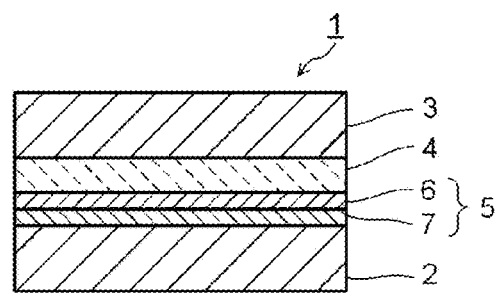
FIG. 1 is a cross-sectional view illustrating a configuration of a first example of a selector device according to at least one embodiment.

At least one embodiment provides a selector device that can improve cycle characteristics and a variable resistance storage device using the same.

In general, according to at least one embodiment, a selector device includes: a first electrode; a second electrode; a selector layer that is disposed between the first electrode and the second electrode; and a stacked film that is disposed in at least one of a portion between the first electrode and the selector layer and a portion between the second electrode and the selector layer, and includes a first layer including at least one first element selected from the group consisting of carbon and metal and not including nitrogen and a second layer including nitride of the first element. The first layer is in contact with the selector layer.

Hereinafter, the selector device and the semiconductor storage device according to at least one embodiment are described with reference to drawings. In each embodiment, substantially the same configuration parts may be designated by the same reference numerals, and the description thereof may be partially omitted. The drawings are schematic, and the relationship between the thickness and the plane dimensions, the ratio of the thickness of each part, and the like may differ from the actual ones.

FIG. 1 is a cross-sectional view illustrating a configuration of a selector device 1 according to an embodiment. The selector device 1 illustrated in FIG. 1 includes a first electrode 2, a second electrode 3, a selector layer 4 disposed between the first electrode 2 and the second electrode 3, and a stacked film 5 disposed between the first electrode 2 and the second electrode 3. The selector layer 4 has a switching function of switching ON and OFF states of a current flowing a portion between the first electrode 2 and the second electrode 3. The selector layer 4 includes electric characteristics of transitioning to an OFF state in which the resistance value is high when the voltage of less than the threshold value (Vth) is applied and rapidly transitioning from an OFF state in which the resistance value is high to an ON state in which the resistance value is low due to the application of the voltage of the threshold value (Vth) or higher.

If the voltage applied to the selector layer 4 is smaller than the threshold value (Vth), the selector layer 4 functions as an insulator, and thus blocks a current flowing into a functional layer, such as a variable resistance layer added to the selector device 1, to cause the functional layer to transition to an OFF state. If the voltage applied to the selector layer 4 is the threshold value (Vth) or higher, the resistance value of the selector layer 4 rapidly decreases and functions as a conductor, so that the current flows into the functional layer via the selector layer 4. The selector device 1 with the selector layer 4 is applied to the on and off control of the current to the functional layer, for example, in the various electronic devices.

Figure 2:
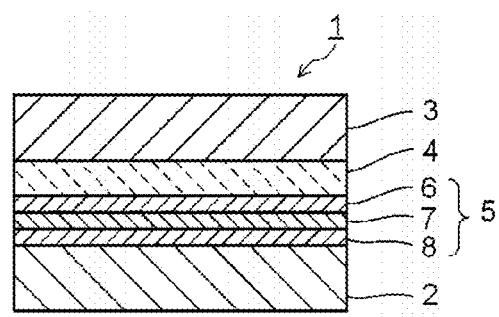
FIG. 2 is a cross-sectional view illustrating a configuration of a second example of the selector device according to at least one embodiment.

In the selector device 1 illustrated in FIG. 1, the stacked film 5 includes a first layer 6 and a second layer 7. The first layer 6 is in contact with the selector layer 4. In FIG. 1, the second layer 7 is in contact with the first electrode 2. As illustrated in FIG. 2, the stacked film 5 may further include a third layer 8. In FIG. 2, the third layer 8 is in contact with the first electrode 2, and the second layer 7 is disposed between the first layer 6 and the third layer 8. The first layer 6 and the third layer 8 are layers that include at least one first element selected from the group consisting of carbon and metal and does not include nitrogen. The second layer 7 is a layer that includes nitride of the at least one first element selected from the group consisting of carbon and metal. Exemplary configurations are described below.

Figure 3:
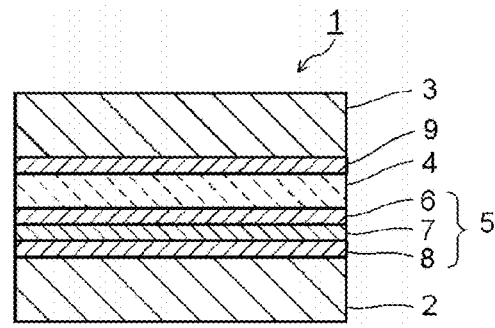
FIG. 3 is a cross-sectional view illustrating a configuration of a third example of the selector device according to at least one embodiment.

In FIGS. 1 and 2, a configuration in which the stacked film 5 is disposed between the first electrode 2 and the selector layer 4, but the stacked film 5 may be disposed between the second electrode 3 and the selector layer 4. The stacked film 5 may be disposed in at least one of a portion between the first electrode 2 and the selector layer 4 or a portion between the second electrode 3 and the selector layer 4. When the stacked film 5 is disposed only in the portion between the first electrode 2 and the selector layer 4, the fourth layer 9 that includes at least one first element selected from the group consisting of carbon and metal and that does not include nitrogen may be disposed between the second electrode 3 and the selector layer 4 as illustrated in FIG. 3. Specific configurations or functions of the first layer 6, the second layer 7, the third layer 8, and the fourth layer 9 are described below in detail.

Figure 4:
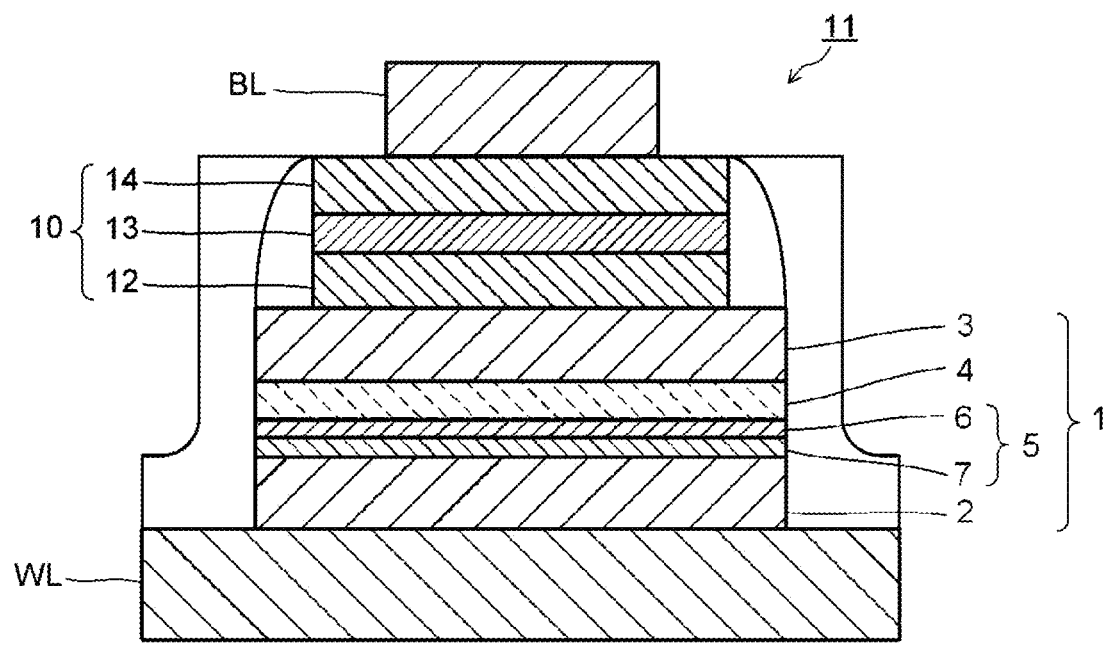
FIG. 4 is a cross-sectional view illustrating a configuration of a semiconductor storage device using the selector device according to at least one embodiment.
Figure 5:
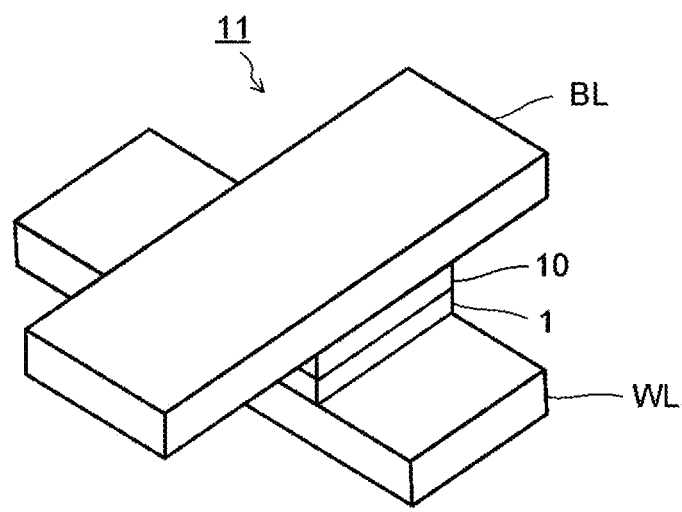
FIG. 5 is a perspective view illustrating the semiconductor storage device illustrated in FIG. 4.

As illustrated in FIGS. 4 and 5, for example, the selector device 1 illustrated in FIGS. 1 to 3 is applied to a variable resistance semiconductor storage device 11 combined with a variable resistance device 10. The variable resistance semiconductor storage device 11 illustrated in FIGS. 4 and 5 includes the selector device 1 and the variable resistance device 10 disposed thereon. The variable resistance device 10 includes a third electrode 12, a variable resistance layer 13 that functions as a nonvolatile memory layer, and a fourth electrode 14. The variable resistance semiconductor storage device 11 may include the first electrode 2, the stacked film 5, the selector layer 4, the second electrode 3, the third electrode 12, the variable resistance layer 13, and the fourth electrode 14. Though not illustrated, in FIG. 4, a fourth layer 9 may be disposed between the selector layer 4 and the second electrode 3.

The second electrode 3 and the third electrode 12 may be omitted. Here, the stacked film 5, the selector layer 4, and the variable resistance layer 13 are arranged between the first electrode 2 and the fourth electrode 14 in a stacked state. The stacked film 5, the selector layer 4, the fourth layer 9, and the variable resistance layer 13 may be arranged between the first electrode 2 and the fourth electrode 14 in a stacked state. Here, the selector layer 4 and the variable resistance layer 13 may be directly stacked, or another layer such as an intermediate layer or an additional layer may be interposed therebetween. The selector layer 4 and the variable resistance layer 13 may be stacked via the fourth layer 9. The variable resistance layer 13 is stacked on the selector layer 4 directly or via another layer and also may be electrically connected to the selector layer 4. One of the second electrode 3 and the third electrode 12 may be omitted.

The configuration materials of the first electrode 2 that is in contact with the selector layer 4 via the stacked film 5 and the second electrode 3 that is directly or indirectly in contact with the selector layer 4 are not particularly limited. In the first electrode 2 and the second electrode 3, for example, a W film, a TiN film, a W/TiN stacked film, a TiN/Ti stacked film, a C/TiN/Ti stacked film, a C/W/TiN stacked film, and the like are used. Metal electrodes made of a W alloy, Cu, a Cu alloy, Al, an Al alloy, and the like that are used as electrodes in various semiconductor elements may be applied to the first and second electrodes 2 and 3.

As the variable resistance layer 13, a memory layer in a variable resistance memory is used. As the variable resistance memory, a resistive random access memory (ReRAM), a phase change memory (PCM), a magnetoresistive random access memory (MRAM) and the like are known. The memory layers of various variable resistance memories are used as the variable resistance layer 13. The variable resistance layer 13 is not limited to a single layer structure, and may be a multilayer film required to exhibit functions of each memory. For example, a phase change material including at least one element selected from the group consisting of germanium (Ge), tin (Sn), lead (Pb), silicon (Si), and carbon (C), at least one element selected from the group consisting of antimony (Sb), bismuth (Bi), and arsenic (As), and at least one element selected from the group consisting of tellurium (Te), selenium (Se), and sulfur (S) is used in the phase change memory, as the variable resistance layer. Specific examples of the phase change material include GeSbTe, GeTe, CrGeTe, CuGeTe, SbTe, ScSbTe, and AgInSbTe.

Exemplary materials of the third and fourth electrodes 12 and 14 that are directly or indirectly in contact with the variable resistance layer 13 is not particularly limited, but in a similar fashion as the first and second electrodes 2 and 3, for example, a W film, a TiN film, a W/TiN stacked film, a TiN/Ti stacked film, a C/TiN/Ti stacked film, a C/W/TiN stacked film, a W alloy film, a Cu film, Cu alloy film, an Al film, and an Al alloy film are used.

As illustrated in FIGS. 4 and 5, the first electrode 2 of the variable resistance semiconductor storage device 11 is electrically connected to a word line WL, and the fourth electrode 14 is electrically connected to a bit line BL. The variable resistance semiconductor storage device 11 is disposed at the intersection between the word line WL and the bit line BL intersect each other, and functions as a memory cell. In FIGS. 4 and 5, only one variable resistance semiconductor storage device 11 is illustrated, but the variable resistance semiconductor storage devices 11 may be arranged at intersections of the plurality of word lines WL and the plurality of bit lines BL as memory cells to configure a cross-point-type semiconductor storage device.

As the selector layer 4 of the selector device 1, a material (a selector material) with electric characteristics of transitioning to an OFF state in which the resistance value is high when the voltage of less than the threshold value (Vth) is applied and rapidly transitions from an OFF state in which the resistance value is high to an ON state in which the resistance value is low when the application of the voltage of the threshold value (Vth) or higher is used as described above. The specific selector material is not particularly limited, but examples thereof include a material including at least one chalcogen element (a third element) selected from the group consisting of tellurium (Te), selenium (Se), and sulfur (S). Such a selector material may include chalcogenide which is a chalcogenide including a chalcogen element.

Examples of the above material including the chalcogen element include a material including at least one second element selected from the group consisting of germanium (Ge), gallium (Ga), tin (Sn), silicon (Si), indium (In), aluminum (Al), carbon (C), boron (B), antimony (Sb), arsenic (Ab), and phosphorus (P), and at least one third element selected from the group consisting of tellurium (Te), selenium (Se), and sulfur (S). The material including the chalcogen element may further include at least one fourth element selected from the group consisting of silver (Ag), bismuth (Bi), scandium (Sc), copper (Cu), chromium (Cr), titanium (Ti), zirconium (Zr), and hafnium (Hf), or at least one fifth element selected from the group consisting of oxygen (O) and nitrogen (N). Specific examples of the selector material include GeAsSe, GeAsSeSi, GeAsSeSiIn, GeSbTe, GeTe, SbTe, SiTe, and AlTeN.

In the variable resistance semiconductor storage device 11 as illustrated in FIG. 4, the selector layer (switching layer) 4 is electrically connected to the variable resistance layer 13, and includes a function of switching ON and OFF states of the current to the variable resistance layer 13. If the voltage applied to the selector layer 4 is lower than the threshold value (Vth), the selector layer 4 functions as an insulator and blocks the current flowing to the variable resistance layer 13 to cause the variable resistance layer 13 to transition to an OFF state. If the voltage applied to the selector layer 4 exceeds the threshold value (Vth), the resistance value of the selector layer 4 rapidly decreases and functions as a conductor, and thus the current flows to the variable resistance layer 13 via the selector layer 4, to enable the write or read operation of the variable resistance layer 13. The selector device 1 includes a function of switching the ON and OFF states of the variable resistance layer 13 as the memory layer in the variable resistance semiconductor storage device (variable resistance memory) 11.

The selector device 1 according to at least one embodiment includes the selector layer 4 and the stacked film 5 as described above. The stacked film 5 includes the first layer 6 which is in contact with the selector layer 4, the second layer 7 which is in contact with the first layer 6, and the third layer 8 which is in contact with the second layer 7. Here, there is a structure of sandwiching both main surfaces of the selector layer including GeAsSeSiIn and the like with a carbon layer (C layer) and a carbon nitride layer (CN layer). Here, the C layer is disposed on the surface on which the variable resistance layer is present in order to enhance the thermal conductivity with the variable resistance layer. However, the CN layer with low thermal conductivity is disposed on the opposite side (the first electrode 2 side) of the variable resistance layer so as to confine the heat of the selector layer 4. It is found that, when the C/GeAsSeSiIn/CN stacked structure is applied, atoms such as Ge, As, and Se in the selector material move to and the like CN layer by the heat applied during the usage. If the atoms that configure such a selector material move or diffuse, the cycle characteristics of the selector device 1 deteriorate. The movement of the atoms such as Ge, As, and Se to a portion between the C layer and the GeAsSeSiIn layer is not recognized.

The difference between the C layer and the CN layer is based on the difference of the cohesive energies. The cohesive energy described herein is energy required, for example, to decompose layered atoms into pieces. For example, while the cohesive energy of the C layer in the amorphous state is 6.76 eV/atom, the cohesive energy of the CN layer in the amorphous state is 6.19 eV/atom. A layer with a small cohesive energy means that the layer decomposes easily. That is, the CN layer that has a small cohesive energy and is easily decomposed easily takes impurity elements in the film. However, the C layer that has a large cohesive energy and is hardly decomposed hardly takes impurity elements in the film. Accordingly, atoms such as Ge, As, and Se easily move in the CN layer, and atoms such as Ge, As, and Se are stably present in the CN layer.

Figure 6A:
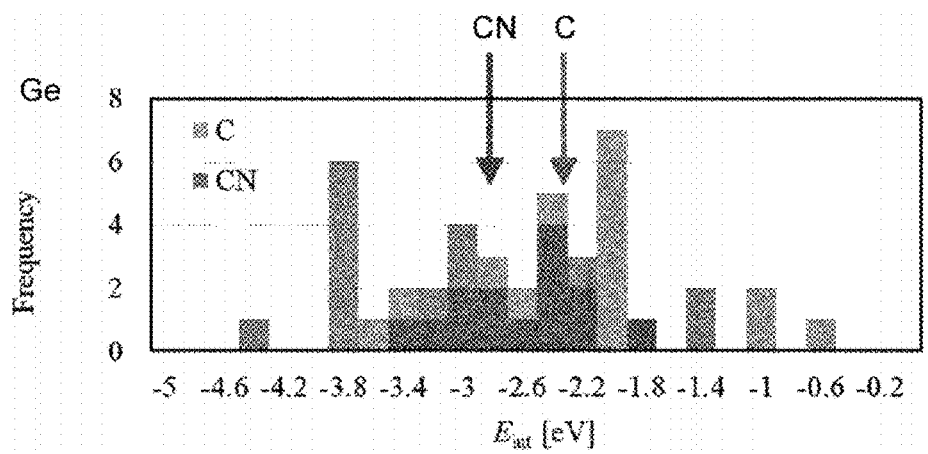
FIGS. 6A to 6C are diagrams illustrating energy changes ($E_{int}$) when configuration atoms of a selector layer are present as isolated atoms and present in a carbon layer and a carbon nitride layer.
Figure 6B:
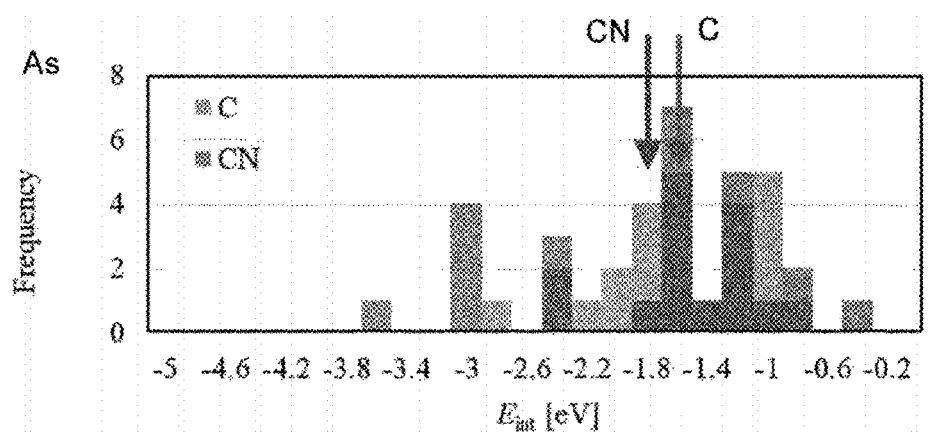
Figure 6C:
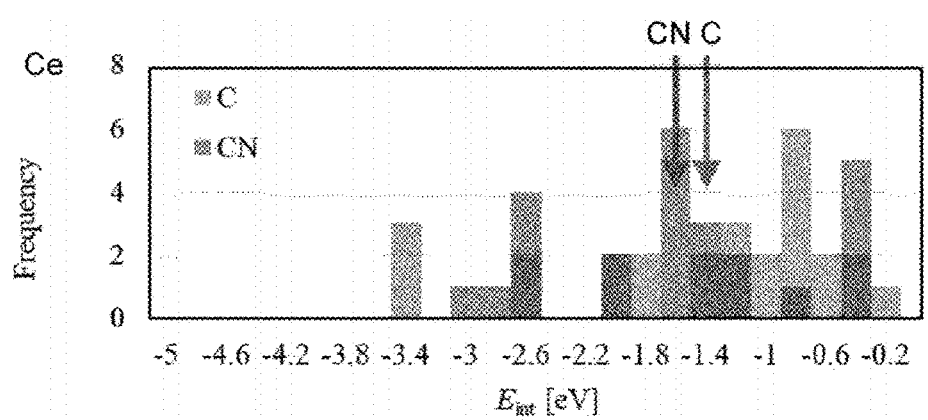

The stability of the atoms such as Ge, As, and Se in the C layer and the CN layer is further reviewed. The energy changes ($E_{int}$) when where each kind of atoms of Ge, As, and Se are present as isolated atoms and are present in the C layer and the CN ($C_{73}N_{27}$) layer are illustrated in FIGS. 6A to 6C. FIGS. 6A to 6C illustrate respective energy changes of Ge (FIG. 6A), As (FIG. 6B), and Se (FIG. 6C). In FIGS. 6A to 6C, arrows indicate average values of the energy change of the respective atoms in the C layer and the CN layer. As illustrated in FIG. 6A, Ge is stable at −0.6 eV in the CN layer. As illustrated in FIG. 6B, As is stable at −0.2 eV in the CN layer. As illustrated in FIG. 6C, Se is stable at −0.1 eV in the CN layer. In this manner, all atoms of Ge, As, and Se are more stable in the CN layer than in the C layer. From the above, it is understood that atoms such as Ge, As, and Se easily move in the CN layer, and atoms such as Ge, As, and Se are stably present in the CN layer.

Figure 7:
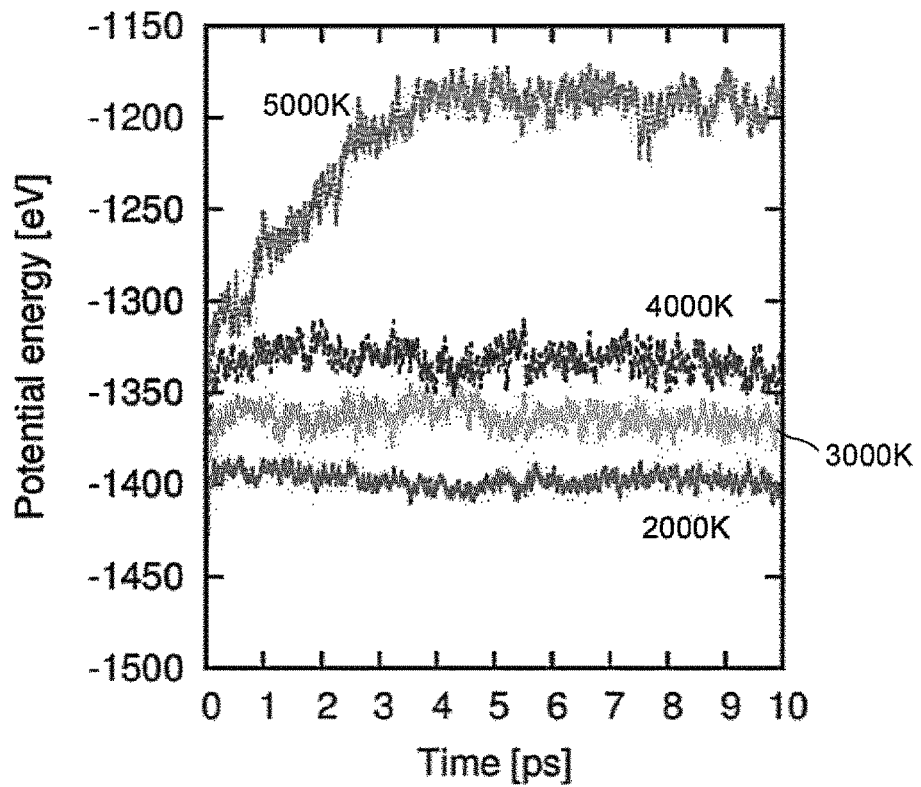
FIG. 7 is a diagram illustrating change tendencies of a potential energy when the temperature and the time at the interface between the carbon layer and the selector layer are changed.
Figure 8:
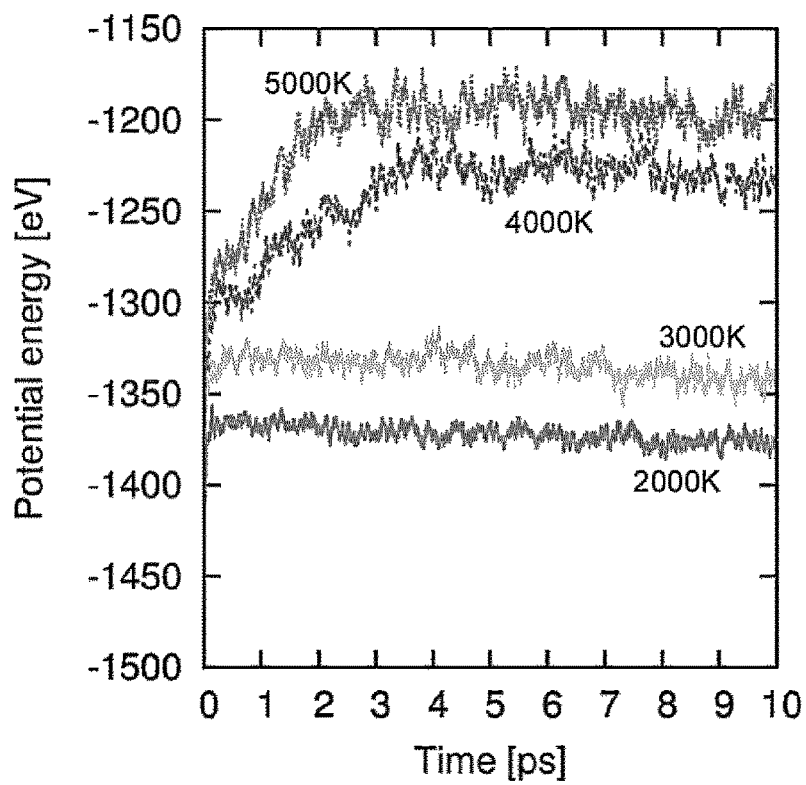
FIG. 8 is a diagram illustrating change tendencies of a potential energy when the temperature and the time at the interface between the carbon nitride layer and the selector layer are changed.

FIG. 7 illustrates change tendencies of the potential energy when the temperature and the time at the interface between the C layer and the GeAsSeSiIn layer are changed. FIG. 8 illustrates change tendencies of the the potential energy when the temperature and the time at the interface between the CN ($C_{80}N_{20}$) layer and the GeAsSeSiIn layer are changed. As clearly understood from the comparison between FIGS. 7 and 8, at the interface with the CN layer, the change of the potential energy is large, and mixing (reaction) easily occurs. It is found that, while the potential energy changes at 3000 K or more at the interface with the CN layer, the potential energy does not change at the interface with the C layer unless the temperature is not 4000 K or more. Therefore, it is understood that, in the CN layer, mixing (reaction) easily occurs at the lower temperature. For example, when the reset current flows in the variable resistance layer 13 including the phase change material, the temperature of the selector layer 4 is about 3400 K. Accordingly, at the GeAsSeSiIn/CN interface, when the reset current flows in the variable resistance layer 13, the atoms such as Ge, As, and Se easily move in the CN layer.

The above relationship between the carbon (C) layer and the carbon nitride (CN) layer is not specific to carbon, but the same tendency is seen also with metals such as tungsten (W), titanium (Ti), molybdenum (Mo), and tantalum (Ta). That is, in each single layer of carbon or metal, elements (such as Ge, As, and Se) of the selector layer 4 hardly move via the interfaces. However, in a nitride layer of carbon or metal, elements of the selector layer 4 easily move via the interfaces, and elements of the selector layer 4 in the nitride layer are stably present. Accordingly, if the nitride layer is directly in contact with the selector layer 4, the cycle characteristics easily deteriorate by the movement of the element of the selector layer 4. The element of the selector layer 4 is not limited to Ge, As, Se, and the like, and the same tendency is seen also with an element when another selector material is used.

Here, in the stacked film 5 of the selector device 1 according to at least one embodiment, the first layer 6 which is in contact with the selector layer 4 includes at least one first element selected from the group consisting of carbon and metal, and a layer not including nitrogen is used. Examples of the first element applied to the first layer 6 include at least one selected from the group consisting of carbon (C), tungsten (W), titanium (Ti), molybdenum (Mo), and tantalum (Ta). In the first layer 6 that includes the elements and does not include nitrogen (N), the elements of the selector layer 4 hardly move, and thus the deterioration of the cycle characteristics by the movement of the elements of the selector layer 4 can be prevented. The first layer 6 effectively prevents drift.

The stacked film 5 of the selector device 1 includes the second layer 7 including nitride of the first element described above. The movement of the element of the selector layer 4 can be prevented by the first layer 6, but each substance of carbon or metal described above has a higher thermal conductivity than nitride, and thus the effect of confining heat in the selector layer 4 cannot be obtained only by the carbon layer or the metal layer. For example, the thermal conductivity of carbon is 1.30 W/m·K, but the thermal conductivity of carbon nitride is 1.08 W/m·K. Accordingly, by disposing the second layer 7 including nitride of the first element on a surface opposite to a surface that is in contact with the selector layer 4 of the first layer 6, effects of preventing the movement of the element of the selector layer 4 and confining heat in the selector layer 4 can be obtained. The nitride in the second layer 7 is not limited to CN, and the same effect can be also obtained when WN, TiN, MoN, TaN, and the like are used.

It is preferable that the stacked film 5 of the selector device 1 includes the third layer 8 provided on the surface opposite to the surface that is in contact with the first layer 6 of the second layer 7. In the same manner as the first layer 6, the third layer 8 is a layer that includes a first element and does not include nitrogen. By applying the third layer 8, the movement of the element of the first electrode 2 (for example, W or Ti) can be prevented, and drift can be further prevented. Here, the expression "not including nitrogen" in the first layer 6 or the third layer 8 means not including nitrogen to function as nitride, and it is acceptable to include nitrogen as impurities.

In the selector device 1 according to at least one embodiment, the stacked film 5 may be disposed between the selector layer 4 and the second electrode 3 in the same manner as the disposition between the first electrode 2 and the selector layer 4. However, as illustrated in FIG. 3, it is preferable to dispose the fourth layer 9 that includes the first element and does not include nitrogen. The fourth layer 9 that includes the first element and does not include nitrogen has a higher thermal conductivity than nitride. By disposing the fourth layer 9 on the variable resistance layer 13 side of the selector layer 4, the thermal conductivity between the selector layer 4 and the variable resistance layer 13 can be enhanced, and drift can be further prevented.

In the selector device 1 according to at least one embodiment, the entire thickness of the stacked film 5 is preferably 10 nm to 11 nm. The film thicknesses of the first layer 6 and the third layer 8 each is preferably 0 nm to 1 nm. The film thickness of the second layer 7 is preferably 8 nm to 10 nm. If the fourth layer 9 is applied, the film thickness is preferably 15 nm to 16 nm. The film thickness of the selector layer 4 is appropriately adjusted.

In the selector device 1 according to at least one embodiment, the selector layer 4 and the stacked film 5 that includes the first layer 6 and the second layer 7 are disposed between the first electrode 2 and the second electrode 3, a layer that includes at least one first element selected from the group consisting of carbon and metal and does not include nitrogen is applied to the first layer 6, and a layer that includes nitride of the first element is applied to the second layer 7. The first layer 6 of the stacked film 5 is in contact with the selector layer 4. According to the selector device 1, the movement of the element that configures the selector layer 4 by the first layer 6 can be prevented, and also the heat confinement effect of the selector layer 4 can be enhanced by the second layer 7. Accordingly, the characteristics of the selector device 1, and the characteristics and reliability of the semiconductor storage device 11 and the like can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A selector device comprising:
a first electrode;
a second electrode;
a selector layer disposed between the first electrode and the second electrode; and
a stacked film disposed in at least one of (i) between the first electrode and the selector layer or (ii) between the second electrode and the selector layer, the stacked film including a first layer and a second layer, wherein
the first layer includes at least one first element selected from the group consisting of carbon and metal, and not including nitrogen,
the second layer including a nitride of the first element, the first layer is in contact with the selector layer, and the first layer includes carbon, and the second layer includes nitride of carbon.

2. The selector device according to claim 1, wherein the first element includes at least one selected from the group consisting of carbon, tungsten, titanium, molybdenum, and tantalum.

3. The selector device according to claim 1, wherein the stacked film includes a third layer that includes the first element and not including nitrogen, and the third layer is in contact with at least one of the first electrode or the second electrode, and the second layer is disposed between the first layer and the third layer.

4. The selector device according to claim 1, wherein the stacked film is disposed in one of a portion between the first electrode and the selector layer or a portion between the second electrode and the selector layer, and
the selector device includes a fourth layer, the fourth layer includes the first element and not including nitrogen, the fourth layer disposed in the other of the portion between the first electrode and the selector layer or the portion between the second electrode and the selector layer on which the stacked film is not disposed.

5. The selector device according to claim 4, wherein the third layer includes carbon.

6. The selector device according to claim 1, wherein the selector layer includes at least one second element and at least one third element, the at least one second element selected from the group consisting of germanium, gallium, tin, silicon, indium, aluminum, carbon, boron, antimony, arsenic, and phosphorus, and the at least one third element selected from the group consisting of tellurium, selenium, and sulfur.

7. The selector device according to claim 5, wherein the selector layer further includes at least one fourth element selected from the group consisting of silver, bismuth, scandium, copper, chromium, titanium, zirconium, and hafnium.

8. The selector device according to claim 5, wherein the selector layer further includes at least one fifth element selected from the group consisting of oxygen and nitrogen.

9. The selector device according to claim 6, wherein the selector layer includes germanium, silicon, indium, arsenic, and selenium.

10. The selector device according to claim 6, wherein the selector layer includes a chalcogen.

11. A semiconductor storage device comprising:
the selector device according to claim 1; and
a variable resistance layer electrically connected to the selector layer of the selector device and being stacked with the selector layer.

12. The semiconductor storage device according to claim 11, further comprising a third electrode between the variable resistance layer and the second layer.

13. The semiconductor storage device according to claim 11, wherein the variable resistance layer includes a phase change memory layer.

14. The semiconductor storage device according to claim 13, wherein the phase change memory layer includes at least one of GeSbTe, GeTe, CrGeTe, CuGeTe, SbTe, ScSbTe, or AgInSbTe.

15. The semiconductor storage device according to claim 11, wherein the variable resistance layer has a multilayer structure.

16. The semiconductor storage device according to claim 11, further including a word line contacting the first electrode.

17. A semiconductor storage device comprising:
the selector device according to claim 5; and
a variable resistance layer electrically connected to the selector layer of the selector device and being stacked with the selector layer.

* * * * *